United States Patent [19]

Hosoya

[11] 4,422,095
[45] Dec. 20, 1983

[54] VIDEO TONE CONTROL CIRCUIT

[75] Inventor: Nobukazu Hosoya, Nara, Japan

[73] Assignee: Sanyo Electric Co., Ltd., Osaka, Japan

[21] Appl. No.: 299,118

[22] Filed: Sep. 3, 1981

[30] Foreign Application Priority Data

Sep. 8, 1980 [JP] Japan .................................. 55-124938

[51] Int. Cl.³ .............................................. H04N 5/14
[52] U.S. Cl. ..................................... 358/166; 358/37; 358/38; 358/168; 358/169
[58] Field of Search ............... 358/166, 168, 169, 174, 358/37, 38, 21 R

[56] References Cited

U.S. PATENT DOCUMENTS

| | | | |
|---|---|---|---|
| 3,577,152 | 5/1971 | Yahagi | 358/38 |
| 3,852,523 | 12/1974 | Humphrey | 358/38 |
| 4,080,627 | 3/1978 | Wheeler | 358/169 |
| 4,081,836 | 3/1978 | Skinner | 358/166 |
| 4,091,420 | 5/1978 | Omori | 358/166 |

*Primary Examiner*—Tommy P. Chin
*Attorney, Agent, or Firm*—Armstrong, Nikaido, Marmelstein & Kubovcik

[57] ABSTRACT

A video tone control circuit is implemented in an integrated circuit and comprises a sharpness control for differentiating a rise and fall of a video signal for controlling the amplitude of a high frequency component in the thus obtained video signal with a variable gain amplifying circuit for providing a video signal with the differentiated output superimposed thereon, and a softness control for changing an attenuation amount of a high frequency component in the video signal with a low pass filter. Either of the variable gain amplifying circuit and the low pass filter is enabled responsive to the level between a first range or a second range of the direct current bias voltage, while the other is disabled. When the direct current bias voltage is set in the first level range, the gain of the variable gain amplifying circuit is controlled so that the degree of emphasizing a high frequency component is changed, whereas when the direct current bias voltage is set in the second level range the degree of attenuating a high frequency component by the low pass filter is changed. A current mirror circuit for preventing fluctuation of the direct current voltage level is connected to the variable gain amplifying circuit.

13 Claims, 10 Drawing Figures

VIDEO TONE CONTROL CIRCUIT

BACKGROUND OF THE INVENTION

1. Field of the Invention

The present invention relates to a video tone control circuit of a color television receiver. More specifically, the present invention relates to a video tone control circuit for controlling a contour of a picture to be sharp or soft by emphasizing or attenuating a high frequency component in a video signal.

2. Description of the Prior Art

FIG. 1 is a block diagram showing an outline of a conventional color television receiver constituting the background of the invention and FIG. 2 is a graph showing one example of a frequency characteristic of a video signal for the purpose of video tone control.

Now referring to FIGS. 1 and 2, a video tone control circuit will be briefly described. A broadcasting wave is received by a tuner 3 through an antenna 2 and a video intermediate frequency signal is obtained from the tuner 3. The video intermediate frequency signal is applied through a video intermediate frequency amplifier 4 to a video detecting circuit 5. The video detecting circuit 5 detects the video intermediate frequency signal and provides a video signal to a contrast circuit 7 and a color process circuit 11. The contrast circuit 7 adjusts a contrast ratio of the video signal and provides the output signal to a video tone control circuit 8. The video tone control circuit 8 serves to control the contour of a picture to be sharp and also to control the contour of the picture to be soft. The former control is referred to as a sharpness control and the latter control is referred to as a softness control. The output signal from the video tone control circuit 8 is applied to a brightness control circuit 9, whereby the brightness is adjusted. The output signal from the brightness control circuit 9 is applied through a video output circuit 10 to a color matrix circuit 12. On the other hand, the color process circuit 11 demodulates color difference signals from the video signal and provides the same to the above described color matrix circuit 12. The color matrix circuit 12 is responsive to the color difference signals and the brightness signal to provide R, G and B signals, which are applied to a cathode-ray tube 13.

Meanwhile, the above described video tone control circuit 8 has a frequency characteristic for the input video signal, which is approximately flat between 0 to 4 MHz, as shown by the curve A in FIG. 2. In order to perform a sharpness control, it is necessary to emphasize the video signal in the vicinity of the frequency of 2 MHz by say 3 to 6 dB, as shown by the curve B in FIG. 2. On the other hand, in the case of a softness control, it is necessary to control the video signal so that the same is attenuated in the vicinity of the frequency of 2 MHz by say 3 dB, as shown by the curve C in FIG. 2. More specifically, the video tone control circuit need comprise a circuit for emphasizing a high frequency component of the video signal in order to perform a sharpness control and a circuit for attenuating a high frequency component of the video signal for performing a softness control. A video tone control circuit comprising a sharpness control and a softness control has already been proposed and the same has also been implemented in an integrated circuit. However, a conventional video tone control circuit comprised an amplifying circuit for performing a sharpness control and an amplifying circuit for performing a softness control which are separately provided. Since a conventional video tone control circuit is structured such that each of the amplifying circuits for performing sharpness control and softness control, respectively, is controlled with respect to the gain thereof and accordingly a circuit configuration became unavoidably complicated. In addition, an LC filter and the like is required in order to emphasize or attenuate a high frequency component. A conventional video tone control circuit employed these components all as externally connected components of an integrated circuit. Therefore, as the number of components being externally connected of an integrated circuit increases, the number of terminals of an integrated circuit for externally connecting these components accordingly increases. As well known, an increase of the number of terminals of an integrated circuit is not much preferred.

SUMMARY OF THE INVENTION

A second circuit means is responsive to a level of a direct current bias voltage to enable any one of a first circuit means and a filter means and to disable the other. When the first circuit means is enabled, a high frequency component of a video signal is emphasized at the degree associated with the level of the direct current bias voltage and the emphasized output is obtained from an output means. On the other hand, when the filter means is enabled, a high frequency component of the video signal is attenuated at the degree associated with the level of the direct current bias voltage and the output is obtained from the output means.

According to the present invention, a sharpness control and a softness control are switched responsive to the level of a direct current bias voltage and at the same time a ratio of emphasizing or attenuating a high frequency component of a video signal is arbitrarily changed responsive to a direct current bias voltage in a first or second level range. Accordingly, it becomes unnecessary to selectively switch a sharpness control and a softness control and to individually control a gain of each of the amplifying circuit, which simplifies a circuit configuration of the present invention.

In a preferred embodiment of the present invention, a video signal is differentiated and the differentiated output is applied to a variable gain amplifier. The variable gain amplifier is enabled and the low pass filter is disabled responsive to the first level range of the direct current bias voltage, wherein the amplitude of the differentiated output is changed by setting the direct current bias voltage to a first level range and by controlling a gain of the variable gain amplifier. The differentiated output of video signal whose amplitude has been changed is superimposed on the video signal by means of a base grounded transistor circuit, whereby a higher frequency component of the video signal is emphasized at an arbitrary ratio, whereby a sharpness control can be achieved. On the other hand, the variable gain amplifier is disabled and the low pass filter is enabled, as the direct current bias voltage is set to the second level range. By applying the direct current bias voltage of the second level range to a semiconductor variable impedance device connected to the low pass filter, a high frequency component in a video signal is attenuated as a function of a time constant associated with an internal impedance of the semiconductor variable impedance device in accordance with the direct current bias voltage, whereby a softness control can be achieved. Thus, since the present invention makes it possible to control switching between a sharpness control and a softness control by means of a single direct current bias voltage setting means and to control the degree of emphasizing a high frequency component and the degree of attenuating a high frequency component in the video signal, a direct current bias voltage control circuit can be implemented with a relatively simple structure.

In another preferred embodiment of the present invention, by connecting a current mirror circuit to the output of the variable gain amplifier, a change of a direct current voltage level in the base grounded transistor circuit can be substantially prevented irrespective of a change of the direct current level in the variable gain amplifier.

In a further preferred embodiment of the present invention, a capacitor of a low pass filter is charged with a rise of the video signal through a diode connection and the capacitor is discharged through a transistor. The direct current bias voltage is received by the transistor and accordingly a discharge amount of the capacitor can be controlled in accordance with the ratio of conduction of the transistor. The direct current bias voltage is selected such that the conduction time period of the transistor is approximately equal to a charging time period in which the capacitor is changed through the diode connection. As a result, the slopes of the rise and fall of the video signal can be made substantially equal to each other in the softness control.

In still a further preferred embodiment of the present invention, a base grounded transistor circuit, a variable gain amplifier, a current mirror circuit, a capacitor of a low pass filter, a semiconductor variable impedance device, and an output circuit are implemented in an integrated circuit. As a result, only a differentiating circuit and a direct current bias voltage setting circuit need be provided as externally connected components of the integrated circuit. Therefore, the number of terminals of the integrated circuit is decreased.

Accordingly, a principal object of the present invention is to provide a video tone control circuit which is relatively simple in structure and can reduce the number of terminals and thus is most suited for implementation in an integrated circuit.

One aspect of the present invention resides in a video tone control circuit, wherein the degree of emphasizing or the degree of attenuating a high frequency component in a video signal can be controlled responsive to a common direct current bias circuit.

Another aspect of the present invention resides in a video tone control circuit, wherein the attenuating ammonia of a rise and fall of a video signal can be made approximately equal to each other in the softness control.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
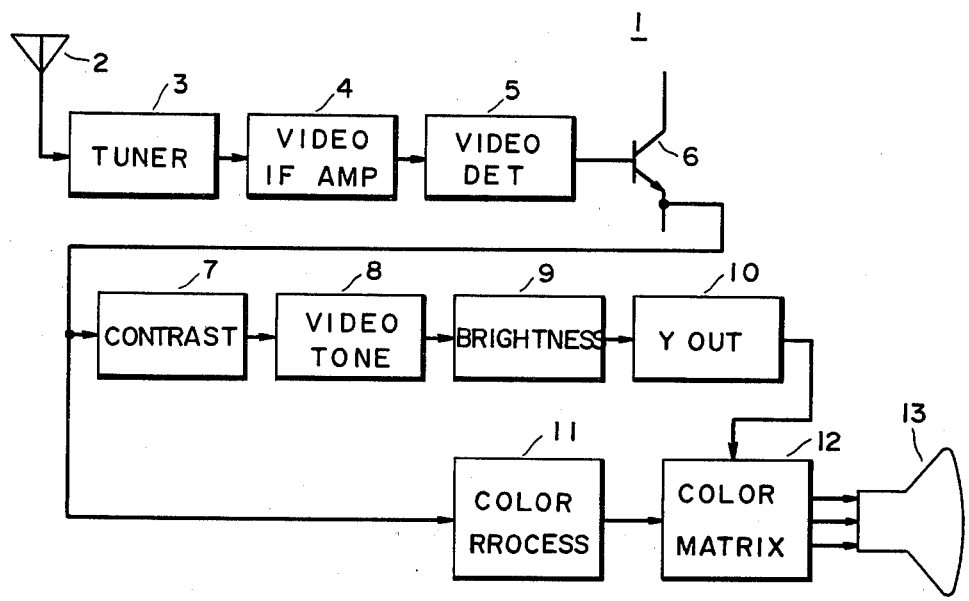
FIG. 1 is a block diagram of an outline of a conventional color television receiver which constitutes the background of the invention.
Figure 2:
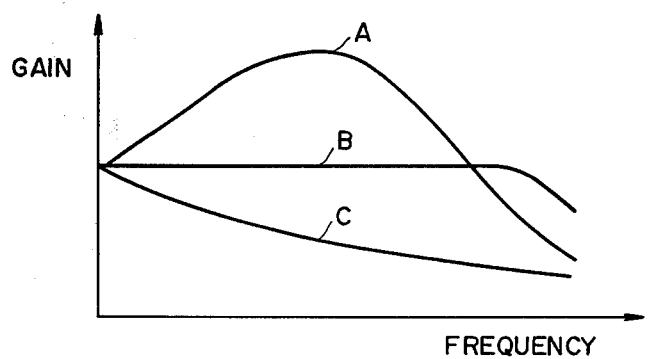
FIG. 2 is a graph showing one example of a frequency characteristic of a video signal for video tone control.
Figure 3:
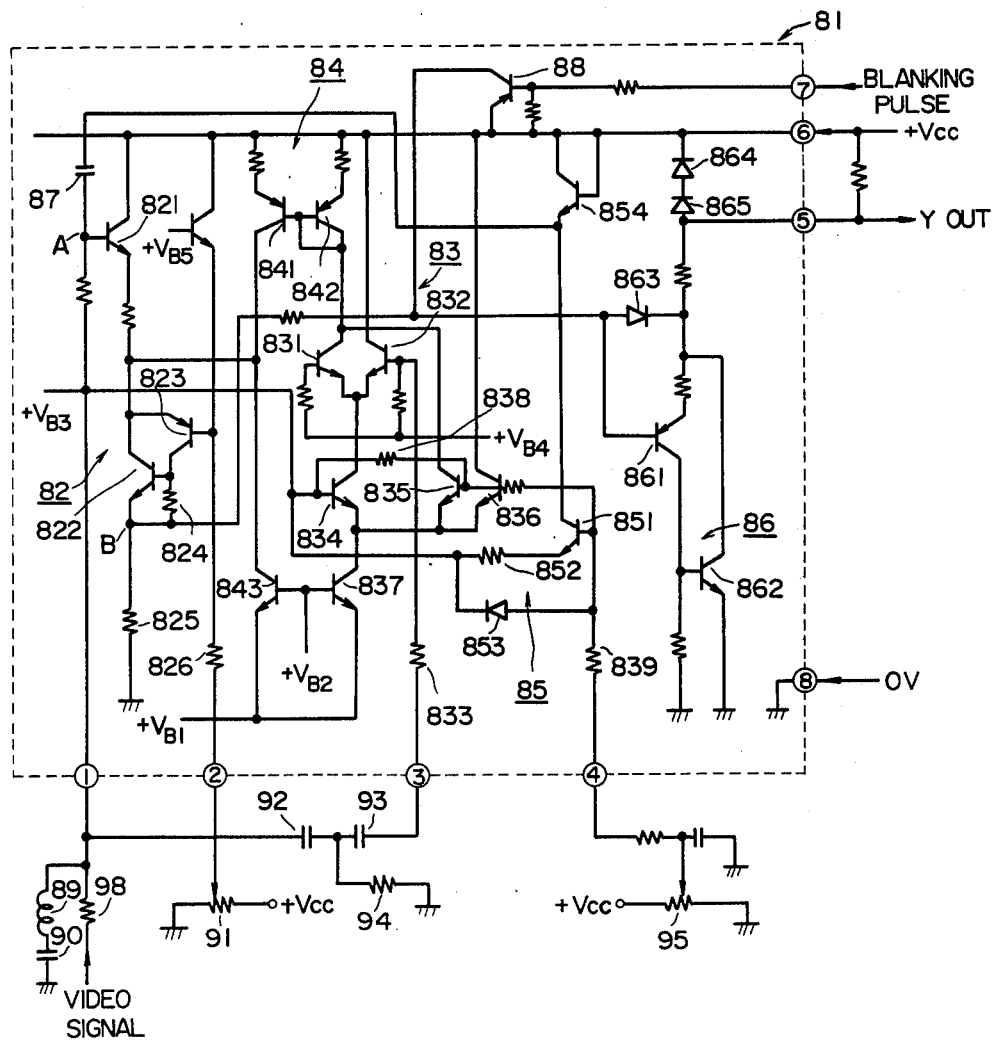
FIG. 3 is a schematic diagram of one embodiment of the present invention.

FIG. 3 is a schematic diagram of one embodiment of the present invention. Referring to FIG. 3, a video tone control circuit 8 comprises an integrated circuit 81 having terminals 1 to 8. The integrated circuit 81 comprises a main signal circuit 82, a variable gain amplifying circuit 83, a current mirror circuit 84, a switch control circuit 85, and an impedance converting circuit 86. The main signal circuit 82, the variable gain amplifying circuit 83 and the current mirror circuit 84 constitute a first circuit means, whereas the switch control circuit 85 constitutes a second circuit means, the impedance converting circuit 86 constituting an output means. The main signal circuit 82 is aimed to superimpose a differentiated signal corresponding to a rise and fall of the video signal on the video signal. More specifically, the main signal circuit 82 comprises an emitter follower transistor 821 connected to receive a video signal from the terminal 1 through a resistor 98, and transistors 822 and 823 connected in an inverted Darlington fashion to consitute a base grounded transistor circuit. The collector of the transistor 822 and the emitter of the transistor 823 are commonly connected to receive the video signal from the emitter of the transistor 821 and also connected to the current mirror circuit 84. The base of the transistor 823 is connected to the terminal 2 through a resistor 826. An externally connected variable resistor 91 is connected to the terminal 2 for setting a brightness control voltage. The emitter of the transistor 822 is connected to the ground serving as a first reference potential through a resistor 825 and is also connected to the above described impedance converting circuit 86. The base of the transistor 822 is connected to the collector of the transistor 823. A resistor 824 is connected between the emitter and base of the transistor 822. Meanwhile, a trap circuit including a coil 89 and a capacitor 90 for removing a color subcarrier component from the video signal is connected to the terminal 1.

The variable gain amplifying circuit 83 is aimed to control the amplitude of the differentiated signal of the rise and fall of the video signal responsive to the level of the direct current bias voltage for supplying the output to the above described current mirror circuit 84. More specifically, a series connection of capacitors 92 and 93 is connected between the terminals 1 and 3 and the junction of the capacitors 92 and 93 is connected through a resistor 94 to the ground. These capacitors 92 and 93 and a resistor 94 and a resistor 833 included in the integrated circuit 81 altogether constitute a differentiating circuit for differentiating the video signal two times. The two-times differentiated output is applied to the variable gain amplifying circuit 83. The variable gain amplifying circuit 83 comprises transistors 831 to 837. The transistors 831 and 832 altogether constitute a differential amplifying circuit. More specifically, the emitter of the transistor 831 and the emitter of the transistor 832 are commonly connected to the collector of the transistor 834. The collector of the transistor 831 is connected to the current mirror circuit 84 and the collector of the transistor 832 is connected to a voltage source +Vcc serving as a second reference potential. The base of the transistor 832 is supplied with the above described differentiated output. The transistor 834 and the transistors 835 and 836 together constitute a differential circuit, which is responsive to the direct current bias voltage for disabling or enabling the differential amplifying circuit including the above described transistors 831 and 832 and at the same time to control the gain thereof. To that end, the collector of the transistor 834 is connected to the emitters of the transistors 831 and 832. The emitter of the transistor 834 is connected to the emitters of the transistors 835 and 836 and is also connected to the collector of a constant current transistor 837. The collector of the transistor 835 is connected to the collector of the above described transistor 831 and the collector of the transistor 836 is connected to the voltage source +Vcc. Furthermore, The bases of the transistors 835 and 836 are supplied with the direct current bias voltage. The direct current bias voltage is also applied to the base of the transistor 834 through a resistor 838.

Figure 4:
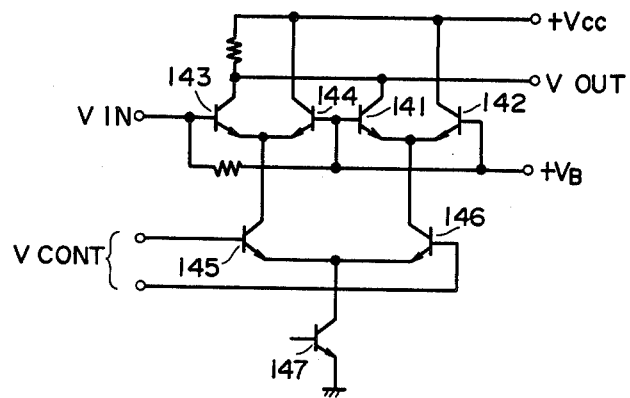
FIG. 4 is a schematic diagram showing another example of a variable gain amplifier for use in one embodiment of the present invention.

Since the variable gain amplifying circuit 83 is thus structured, the transistors 145 and 146 can be omitted as compared with a conventional variable gain amplifying circuit shown in FIG. 4. Therefore, the bases of the transistors 835 and 836 are supplied with a bias voltage lower than that for the transistors 141 and 142 of the conventional variable gain amplifying circuit 14 and accordingly the respective base/collector voltages of the transistors 835 and 836 become larger. Therefore, the base/collector capacitance of these transistors become smaller and are negligible as compared with those of the variable gain amplifying circuit 14 shown in FIG. 4. As a result, degradation of the frequency characteristic of the amplifying circuit due to such base/collector capacitances can be eliminated. Meanwhile, degradation of the frequency characteristic would more or less result even when the variable gain amplifying circuit 83 shown in FIG. 3 is replaced by the variable gain amplifying circuit 14 shown in FIG. 4 but nevertheless such circuit is not unpracticable at all.

Figure 5:
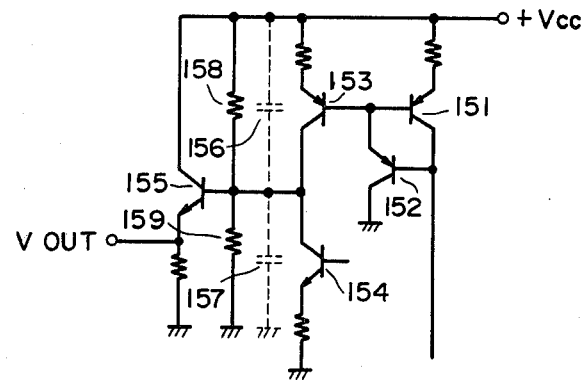
FIG. 5 is a schematic diagram showing one example of a conventional current mirror circuit shown in comparison with one embodiment of the present invention.

The above described current mirror circuit 84 serves to prevent a change in the level of the direct current voltage in the output from the variable gain amplifying circuit 83 and at the same time to provide the differentiated signal the amplitude of which has been controlled by the variable main amplifying circuit 83 to the above described main signal circuit 82. The current mirror circuit 84 comprises PNP transistors 841 and 842 and an NPN transistor 843. The collector of the transistor 842 is connected to the collector of the above described transistor 831. The base of the transistor 842 is connected to the collector thereof and is also connected to the base of the transistor 841. The emitters of the transistors 841 and 842 are supplied with the source voltage +Vcc. The collector of the transistor 841 is connected to the collector of the transistor 843 and is also connected to the emitter of the transistor 823 included in the above described main signal circuit 82. Since the output of the current mirror circuit 84 is connected to the emitter of the transistor 823 constituting a base grounded transistor circuit, the base bias resistors 824 and 826 of the transistors 822 and 823 come not to be electrically related with the output capacitances of the transistors 841 and 842. Therefore, low pass filters are not formed with the output capacitances 156 and 157 of the transistors 153 and 154 and the base bias resistors 158 and 159 of the transistor 155, as in the case of the conventional circuit shown in FIG. 5. Accordingly, degradation of the frequency characteristic is prevented. In addition, since the current gain of the base grounded transistor circuit is approximately 0, an influence of a mirror integration effect by means of each junction capacitance of the transistors 822 and 823 is also eliminated and hence the frequency characteristic is much more improved.

The above described switch control circuit 85 is responsive to the level of the direct current bias voltage to enable one of the above described variable gain amplifying circuit 83 and the capacitor 87 and to disable the other and also to control the degree of emphasizing or the degree of attenuating a high frequency component in the video signal. To that end, the switch control circuit 85 comprises the transistor 851, the resistor 852, the diode 853 and the transistor 854. The base of the transistor 851 and the anode of the diode 853 are connected through the resistor 839 to the terminal 4. The terminal 4 is connected to a variable resistor 95 for setting the direct current bias voltage serving a video tone control voltage. One end of the variable resistor 95 is connected to the voltage source +Vcc and the other end of the same is connected to the ground.

The collector of the transistor 851 is connected to the emitter of the transistor 854 serving as a semiconductor variable impedance device. The collector and the base of the transistor 854 are supplied with the source voltage +Vcc. A capacitor 87 serving as a low pass filter is connected between the emitter of the transistor 854 and the base of the transistor 821 included in the above described main signal circuit 82. The above described transistor 854 is responsive to the increase/decrease of a current flowing the emitter thereof to exhibit a change in the internal impedance, thereby to control the attenuation amount of the high frequency component of the video signal by means of the capacitor 87 by disabling or enabling the capacitor 87. The above described transistor 851 and the resistor 852 and the diode 853 altogether constitute a minor constant current source. More specifically, assuming that the voltage between the base and emitter of the transistor 851 is $V_{BE}$, the voltage between the anode and the cathode of the diode 853 is $V_D$, and the resistance value of the resistor 852 is R1, then a current flowing through the resistor 852 when the transistor 851 and the diode 853 are rendered conductive, i.e. the emitter current $I_E$ of the transistor 851 is expressed as $I_E = (1/R1)(V_D - V_{BE})$. In other words, the emitter current of the transistor 851 is not controlled with the direct current bias voltage being applied to the terminal 4 but with the above described potential difference $(V_D - V_{BE})$ changing as a function of the above described voltage. Therefore, according to the embodiment shown, the above described emitter current $I_E$ can be subtly changed. More specifically, the emitter current of the transistor 854 is smoothly changed through the variable resistor 95. This means that the time constant determined by the internal impedance of the transistor 845 and the capacitance of the capacitor can be subtly changed by controlling the internal impedance of the transistor 854 by means of the variable resistor 95.

The above described impedance converting circuit 86 comprises transistors 861 and 862 connected in an inverted Darlington fashion, a diode 863, 864 and 865. The transistor 88 is aimed to insert the horizontal and vertical blanking pluses received at that terminal 7 to the video signal after video tone control obtained from the emitter of the above described transistor 823. The video signal is obtained from the terminal 5 through the transistors 861 and 862 connected in an inverted Darlington fashion. Meanwhile, the diodes 864 and 865 are connected between the terminal 5 and the voltage source +Vcc. The diodes 864 and 865 are aimed to clamp the direct current level of the video signal. Meanwhile, the voltages $V_{B1}$ to $V_{B5}$ shown in the integrated circuit 81 denote the base bias voltages of the respective transistors.

Figure 6:
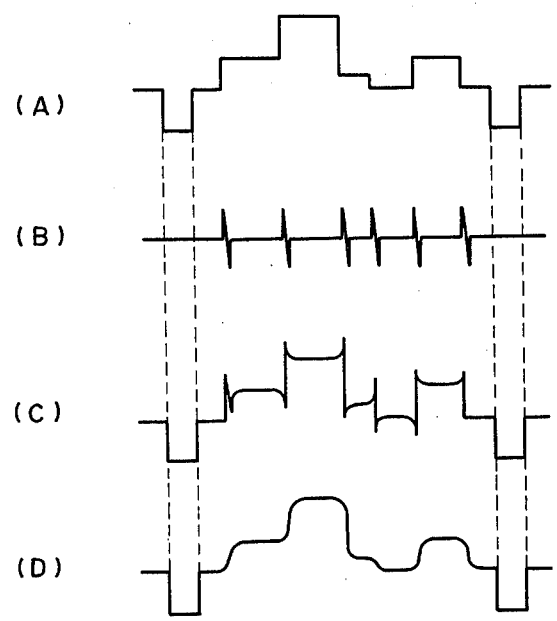
FIG. 6 is a graph showing waveforms of electrical signals at various portions in the FIG. 3 diagram.

FIG. 6 is a graph showing waveforms of the electrical signal at various portions of the FIG. 3 diagram.

Now referring to FIG. 6, an operation of the FIG. 3 embodiment will be described. First let it be assumed that a base bias voltage of the same value as that of the transistor 834 is applied to the transistors 835 and 836 of the variable gain amplifying circuit 83 by means of the variable resistor 95 and a differentiated signal is not applied to the terminal 3. Then, in such situation, an emitter current of $\frac{1}{3}I_0$ flows through each of the transistors 834 to 837 with respect to the emitter current $I_0$ of the transistor 837. The emitter current of the transistor 834 of these transistors is branched to the transistors 831 and 832. Therefore, a current of the sum of these emitter currents of the transistors 831 and 835, i.e. an emitter current of $1/6I_0 + \frac{1}{3}I_0 = \frac{1}{2}I_0$ flows through the transistor 842 of the current mirror circuit 84. Accordingly, a collector current of the same value as $\frac{1}{2}I_0$ flows through the transistor 841. It follows that the above described current is added to the emitter current of the transistor 821 included in the main signal circuit 82 which is in proportion to the magnitude of the video signal to flow through the transistors 822 and 823.

In such a situation, the video signal shown as (A) in FIG. 6 is differentiated two times and a negative pulse, for example, of the signal shown as (B) in FIG. 6 obtained through differentiation is applied to the base of the transistor 832 through the terminal 3, whereby the emitter current of the transistor 832 decreases by $\Delta I_0$. Therefore, the emitter current of the transistor 831, i.e. the collector current of the transistor 841 increases by $\Delta I_0$. Accordingly, it follows that a plus pulse is added to the video signal appearing at the emitter of the transistor 822. Likewise, a positive pulse of the differentiated signal is added to the above described video signal as a minus pulse and as a result the rise and fall of the video signal at the point B are emphasized as shown as (C) in FIG. 6. On that occasion, the amplitude of the above described pulse is adjusted by changing the base bias voltage of the transistors 835 and 836 by means of the variable resistor 95 and by changing the current division ratio of the emitter currents by the transistors 834, 835 and 836 and as a result a desired sharpness control can be achieved. More specifically, when the slider of the variable resistor 95 is brought to the vicinity of the ground so that the base bias voltage of the transistors 835 and 836 may be decreased, the emitter current of the transistor 834 increases. As a result, the amplitude of the above described differentiated pulse increases.

Conversely, when the slider of the variable resistor 95 is brought to be close to the source voltage +Vcc, the base bias voltage of the transistors 835 and 836 increases and the amplitude of the above described differentiated pulse gradually decreases. When the base bias voltage of the transistors 835 and 836 becomes sufficiently higher than that of the transistor 834, the transistors 835 and 836 become in a saturated state while the transistor 834 becomes in a cutoff state. Therefore, the variable gain amplifying circuit 83 is disabled and a sharpness control is brought to a stop. When the direct current bias voltage applied to the terminal 4 further increases from that state, the transistor 851 and the diode 853 of the switch control circuit 85 become an enabled state. Accordingly, in such a situation, an emitter current associated with the above described potential difference $(V_D - V_{BE})$ of the transistor 851 and the diode 853 at that time flows through the transistor 851, whereby the transistor 854 becomes an enabled state. Therefore, the capacitor 87 serving as the low pass filter comes to be connected between the base (point A) of the transistor 821 of the main signal circuit 82 and the voltage source +Vcc, i.e. the ground through the emitter and collector of the transistor 854. As a result, a high frequency component of the video signal being applied to the base of the transistor 821 is attenuated and the rise and fall of the video signal at the point B come to be inclined as shown as (D) in FIG. 6.

On that occasion, the attenuation amount of the high frequency component of the video signal changes in accordance with the impedance between the collector and emitter of the transistor 854. Accordingly, by changing the above described potential difference $(V_D - V_{BE})$ by means of the variable resistor 95, a desired softness control can be achieved. More specifically, by bringing the slider of the variable resistor 95 to the vicinity of the voltage source +Vcc, the emitter current of the transistor 851 increases and the impedance between the collector and emitter of the transistor 854 decreases, whereby the attenuation amount of the high frequency component increases. A horizontal and vertical blanking pulses are then superimposed by means of the transistor 88 on the video signal on which the video tone has thus been controlled. The video signal with the horizontal and vertical pulses inserted is withdrawn from the terminal 5 through the impedance converting circuit 86. On that occasion the video signal obtained from the terminal 5 is clamped with respect to the direct current level by means of the diodes 864 and 865.

Meanwhile, the above described variable gain amplifying circuit 83 was adapted such that only one transistor 835 is connected to the collector of the transistor 831 constituting the differential amplifying circuit. However, in the case where the same is structured such that the differential output is obtained from the differential amplifying circuit, the collectors of the transistors 835 and 836 are connected to the collectors of the transistors 831 and 832, respectively.

Figure 7:
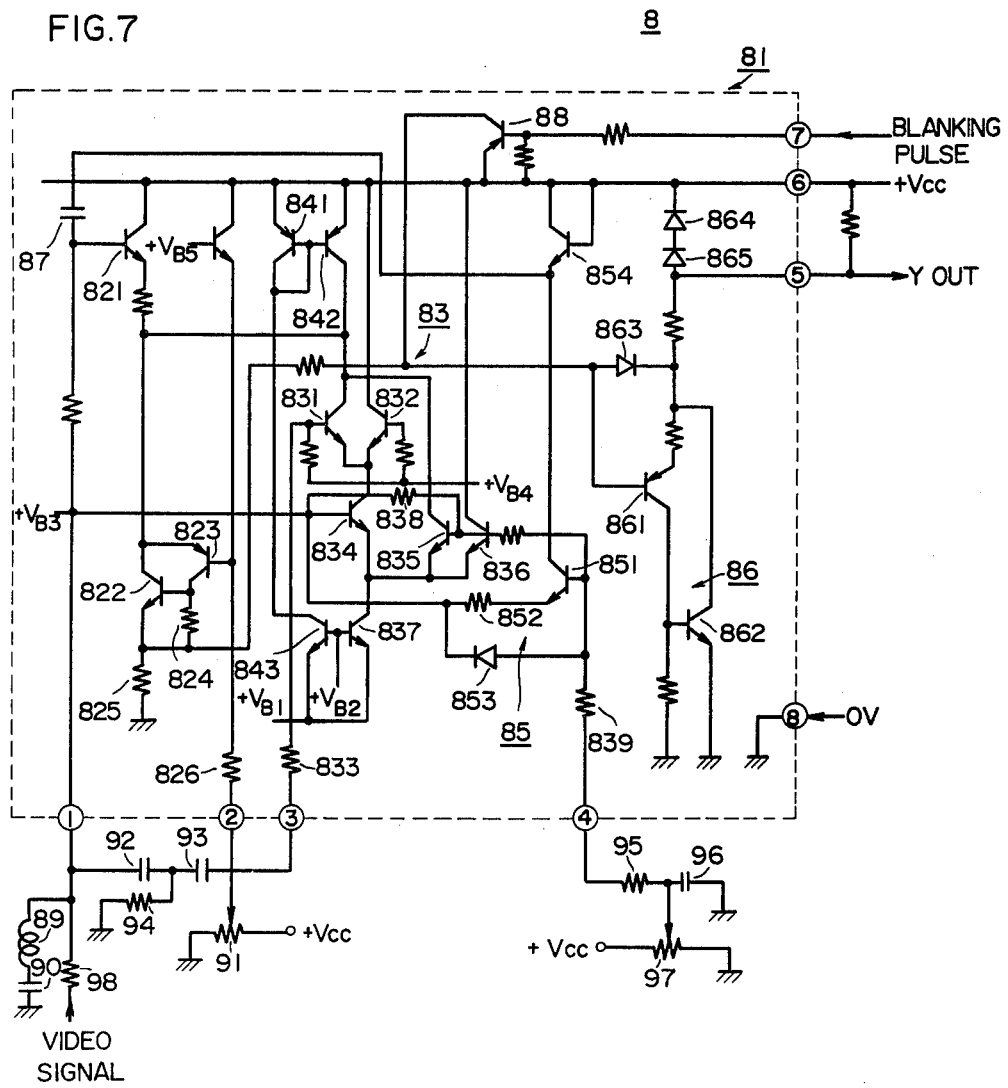
FIG. 7 is a schematic diagram of another embodiment of the present invention.

FIG. 7 is a schematic diagram of still a further embodiment of the present invention. The previously described current mirror circuit 84 shown in FIG. 3 was implemented by the PNP transistors 841 and 842. However, generally a PNP transistor has a low amplification factor $h_{fe}$ and in addition a base/collector capacitance $C_{ob}$ is large, resulting in a disadvantage that an attenuation is large when an alternating current flows. Therefore, the FIG. 7 embodiment comprises a modification wherein the output signal of the variable gain amplifying circuit 83 is directly applied to the emitter of the transistor 823 of the base grounded type transistor circuit without through the current mirror circuit 84. However, since inversion of the polarity takes place when the signal is obtained from the collector of the transistor 831 of the variable gain amplifying circuit 83, the circuit is adapted such that the differentiated signal is applied to the base of the transistor 831. The current mirror circuit 84 is structured such that the base and collector of the transistor 841 are connected to provide a diode connection of the transistor, through which the bias voltage is applied to the base of the transistor 842. The ramaining portions of the FIG. 7 embodiment are the same as those of the previously described FIG. 3 embodiment. By thus forming the variable gain amplifying circuit 83 and the current mirror circuit 84, degradation of the frequency characteristic can be prevented.

Figure 8:
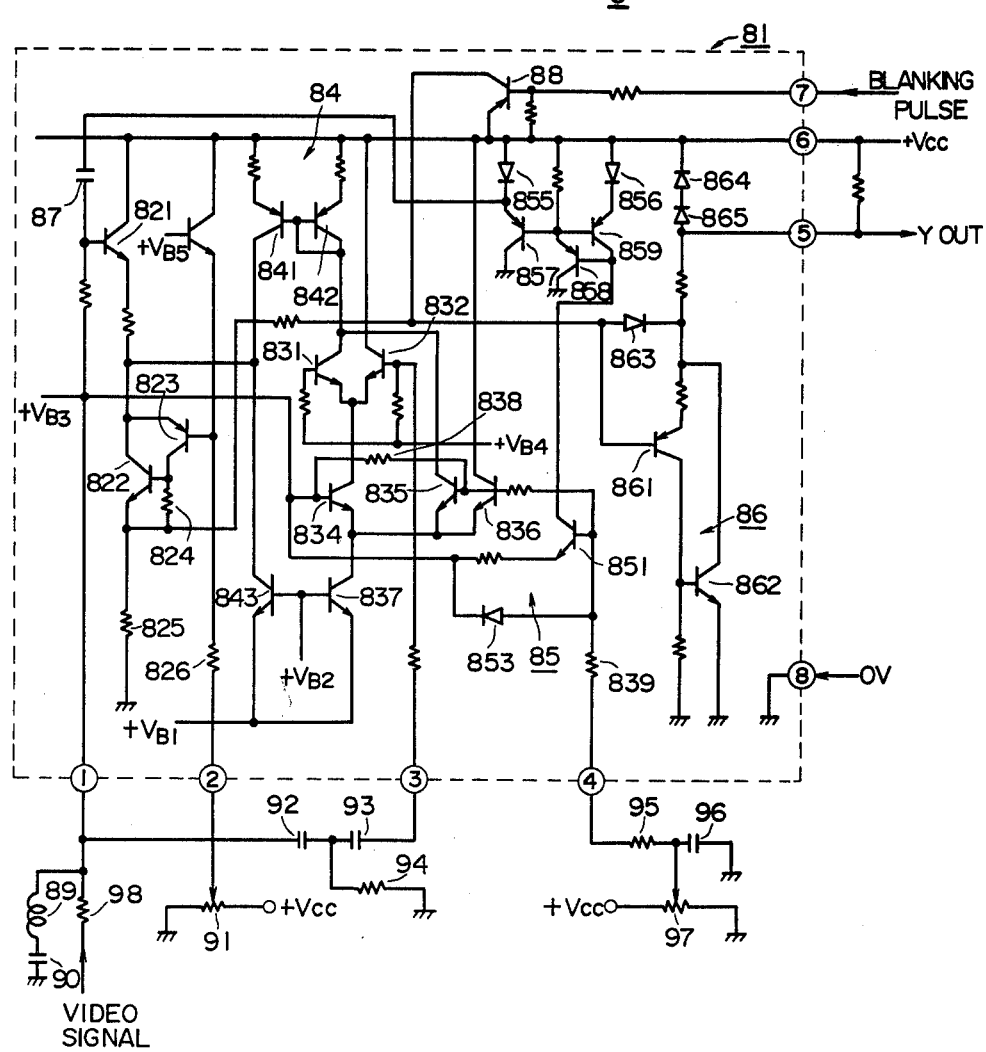
FIG. 8 is a schematic diagram of a further embodiment of the present invention.
Figure 9:
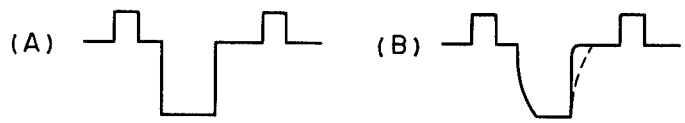
FIGS. 9A and 9B are graphs for showing waveforms for explaining the operation of the FIG. 8 diagram.

FIG. 8 is a schematic diagram showing still a further embodiment of the present invention and FIG. 9 is a graph showing waveforms of the signals for explaining the operation of the FIG. 8 embodiment. The FIG. 9 graph simultaneously shows waveforms for explaining the previously described FIG. 3 embodiment. Referring to FIGS. 3 and 9, first the operation of the FIG. 3 embodiment will be briefly described. The FIG. 3 embodiment operates such that the video signal shown as (A) in FIG. 9 has a steep slope in the fall as shown as (B) in FIG. 9 and an easy slope at the rise. The reason is that on the occasion of the fall of the video signal a large current flows because the electric charge is charged in the capacitor 87 through the collector and emitter of the transistor 854 whereas on the occasion of the rise of of the video signal little discharge current flows because the electric charge stored in the capacitor 87 is not directly discharged to the ground. The FIG. 8 embodiment includes an improvement over such inconvenience. Now referring to FIG. 8, diodes 855 and 856 and transistors 857 to 859 are provided in place of the transistors 851 of the FIG. 3 embodiment. The base of the transistor 858 and the collector of the transistor 859 are connected to the collector of the transistor 851. The collector of the transistor 858 is connected to the ground and the emitter of the transistor 858 is connected to the bases of the above described transistors 857 and 859. The emitter of the transistor 859 is connected to the voltage source +Vcc through the diode 856. The collector of the transistor 857 is connected to the ground and the emitter of the transistor 857 is connected to the capacitor 87 and is also connected to the voltage source +Vcc through the diode 855. By thus constructing the semiconductor variable impedance with a current mirror circuit, the collector current of the transistor 851 flows through base of the transistor 858 and the collector of the transistor 859. Then the current flowing into the collector of the transistor 857 through the diode 855 is controlled as a function of the emitter current of the transistor 858. As a result, the electric charge charged in the capacitor 87 changes. More specifically, when the video signal rises, it follows that the charging current of the capacitor 87 is controlled as a function of the level of the direct current voltage. On the other hand, when the video signal falls, the electric charge stored in the capacitor 87 is discharged through the collector and emitter of the transistor 857. By setting the direct current bias voltage so that the charging time and the discharging time of the capacitor 87, the rise slope of the video signal can be made substantially equal to the fall slope thereof, as shown by the dotted line (B) in FIG. 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A video tone control circuit for emphasizing or attenuating a high frequency component in a video signal, comprising:
   means for providing a video signal,
   direct current bias voltage setting means for variably setting a direct current bias voltage,
   first circuit means for receiving said video signal for emphasizing a high frequency component in said video signal as a function of said direct current bias voltage,
   filter means for receiving said video signal for attenuating a high frequency component in said video signal as a function of said direct current bias voltage,
   second circuit means responsive to said direct current bias voltage for enabling one of said first circuit means and said filter means and for disabling the other, and
   output means for outputting any one of said video signal the high frequency component of which has been emphasized by said first circuit means and said video signal the high frequency component of which has been attenuated by said filter means.

2. A video tone control circuit in accordance with claim 1, wherein
   said first circuit means comprises
   differentiating means for differentiating said video signal,
   superimposing means for receiving said video signal from said video signal providing means for superimposing the output from said differentiating means on said video signal substantially received directly, and
   amplitude changing means provided between said differentiating means and said superimposing means and responsive to said direct current bias voltage for changing the amplitude of the output from said differentiating means being applied to said superimposing means as said direct current bias voltage is changed in a first level range.

3. A video tone control circuit in accordance with claim 2, wherein
   said superimposing means comprises a transistor circuit, said transistor circuit having a first, second and base electrodes,
   said first electrode being connected to receive said video signal substantially directly and the output of said amplitude changing means, said second electrode being connected to said output means, and said base electrode being connected to a first reference potential, whereby said transistor circuit constitutes a base grounded circuit.

4. A video tone control circuit in accordance with claim 2, wherein
   said amplitude changing circuit comprises
   variable gain amplifying means including an input and output, said variable gain amplifying means having the input connected to said output from said differentiating means, the output connected to the input of said superimposing means, the gain of said variable gain amplifying means being determined as a function of said direct current bias voltage in said first level range, and current mirror circuit means connected between a second reference potential and the output of said variable gain amplifying means for substantially preventing a change of the direct current level in the input to said superimposing means irrespective of a change in the direct current level in said variable gain amplifying means.

5. A video tone control circuit in accordance with claim 4, wherein said variable gain amplifying means comprises a differential amplifying circuit including a pair of first and second transistors each having input electrode, output electrode and common electrode, the output electrode of said first transistor being connected to the input of said current mirror circuit means and the output electrode of said second transistor being connected to said second reference potential, the input electrode of said first transistor or said second transistor being connected to receive the output from said differentiating means, and which further comprises a differential circuit for controlling the ratio of the direct current bias current flowing through said first transistor and said second transistor included in said differential amplifying circuit as a function of said direct current bias voltage.

6. A video tone control circuit in accordance with claim 5, wherein said differential circuit comprises a third, fourth and fifth transistors each having input electrode, output electrode and common electrode, said third transistor constituting a common current path of said first and second transistors included in said differential amplifying circuit, and each common electrode of said fourth and fifth transistors connected to the common electrode of said third transistor, the input electrode of said fourth transistor being connected to the output of said direct current bias voltage setting means, and the output electrode of said fourth transistor being connected to the output electrode of said first transistor, the input electrode of said fifth transistor being connected to the input electrode of said fourth transistor, the output electrode of said fifth transistor being connected to the output electrode of said second transistor, and which further comprises constant current circuit means for flowing a constant current commonly to said third, fourth and fifth transistors.

7. A video tone control circuit in accordance with any one of the preceding claims 4 to 6, wherein said current mirror circuit means comprises a first PNP transistor having an emitter connected to said second reference potential and a collector connected to the output of said variable gain amplifying means, a second PNP transistor being connected to said first PNP transistor for providing a constant bias voltage to the base of said first PNP transistor, an output being applied from the collector of said first PNP transistor to said superimposing means.

8. A video tone control circuit in accordance with claim 1, wherein said second circuit means comprises a semiconductor variable impedance device for receiving said direct current bias voltage for exhibiting a change in its internal impedance as said direct current bias voltage is set to a second level range different from said first level range for enabling said filter means.

9. A video tone control circuit in accordance with claim 8, wherein said second circuit means comprises a sixth transistor having an input electrode, an output electrode and a common electrode and a diode device, the input electrode of said sixth transistor being applied with said direct current bias voltage in a substantially direct manner, the output electrode of said sixth transistor being connected to the current path of said semiconductor variable impedance device and said diode device being connected in substantially parallel between the input electrode and the common electrode of said sixth transistor, whereby said sixth transistor and said diode device constitute a minor current source for said semiconductor variable impedance device.

10. A video tone control circuit in accordance with claim 7, wherein said filter means comprises capacitor means having one end connected to receive said video signal and the other end connected to said semiconductor variable impedance device for attenuating a high frequency component in said video signal with a time constant associated with said internal impedance.

11. A video tone control circuit in accordance with claim 10, wherein said semiconductor variable impedance device comprises a first semiconductor device for forming a charging path for said capacitor means, a second semiconductor device for forming a discharging path for said capacitor means, and means responsive to said direct current bias voltage for controlling the internal impedances of said first and second semiconductor devices for changing a charging amount and a discharging amount of said capacitor means.

12. A video tone control circuit in accordance with claim 2, wherein said amplitude changing means comprises variable gain amplifying means having an input and output, the input of said variable gain amplifying means being connected to the output of said differentiating means and the output of said variable gain amplifying means being connected to the input of said superimposing means, the gain of said variable gain amplifying means being determined as a function of the direct current bias voltage in said first level range, and which further comprises current mirror means connected between a second reference potential and the output of said variable gain amplifying means for substantially preventing a change of the direct current level in the input of said superimposing means irrespective of a change in the direct current level in said variable gain amplifying means, and wherein said filter means comprises capacitor means having one terminal connected to the receive said video signal and the other end thereof connected to said semiconductor variable impedance device for attenuating a high frequency component in said video signal with a time constant associated with said internal impedance.

13. A video tone control circuit in accordance with claim 12, which further comprises an integrated circuit having first to sixth terminals, said superimposing means, said variable gain amplifying means, said current mirror means, said capacitor means, said second circuit means, and said output means being implemented in said integrated circuit, said first terminal being connected to receive said video signal in a substantially direct manner and being connected to the input of said superimposing means and to one end of said capacitor means, said second terminal being connected to receive the output from said differentiating means and connected to the input of said variable gain amplifying means, said third terminal being connected to receive the output from said direct current bias voltage setting means and connected to said variable gain amplifying means and said second circuit means, said fourth terminal being connected to the output of said output means, said fifth terminal being connected to said first reference potential, and said sixth terminal being connected to said second reference potential.

* * * * *